United States Patent
Nakazawa et al.

(10) Patent No.: US 9,418,852 B2
(45) Date of Patent: Aug. 16, 2016

(54) METHOD OF MANUFACTURING A SEMICONDUCTOR DEVICE

(75) Inventors: Haruo Nakazawa, Matsumoto (JP); Motoyoshi Kubouchi, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 13/168,439

(22) Filed: Jun. 24, 2011

(65) Prior Publication Data

US 2011/0318910 A1 Dec. 29, 2011

(30) Foreign Application Priority Data

Jun. 24, 2010 (JP) ................................ 2010-143825

(51) Int. Cl.
| | | |
|---|---|---|
| H01L 21/26 | (2006.01) | |
| H01L 21/268 | (2006.01) | |
| H01L 21/324 | (2006.01) | |
| H01L 21/265 | (2006.01) | |
| H01L 29/66 | (2006.01) | |

(52) U.S. Cl.
CPC ............ *H01L 21/268* (2013.01); *H01L 21/324* (2013.01); *H01L 21/26513* (2013.01); *H01L 29/66333* (2013.01)

(58) Field of Classification Search
CPC .................................................. H01L 29/7395
USPC .................................... 219/121.76
See application file for complete search history.

(56) References Cited

U.S. PATENT DOCUMENTS

| | | | |
|---|---|---|---|
| 5,723,882 A * | 3/1998 | Okabe et al. | 257/139 |
| 5,795,816 A * | 8/1998 | Teramoto et al. | 438/479 |
| 6,524,894 B1 | 2/2003 | Nozaki et al. | |
| 7,135,387 B2 * | 11/2006 | Nakazawa et al. | 438/473 |
| 8,114,748 B2 * | 2/2012 | Lee et al. | 438/301 |
| 2001/0005024 A1 | 6/2001 | Bauer et al. | |
| 2003/0119281 A1 | 6/2003 | Suzuki et al. | |
| 2003/0183612 A1 * | 10/2003 | Timans | C30B 31/12 219/390 |
| 2005/0059263 A1 | 3/2005 | Nakazawa et al. | |
| 2008/0227277 A1 * | 9/2008 | Nakazawa | 438/550 |
| 2010/0316071 A1 * | 12/2010 | Kimberlin et al. | 372/17 |

FOREIGN PATENT DOCUMENTS

| | | |
|---|---|---|
| JP | 2002-520885 A | 1/2000 |
| JP | 2001-160559 A | 6/2001 |
| JP | 2003-059856 A | 2/2003 |
| JP | 2003-528462 A | 9/2003 |
| JP | 2004-253527 A | 9/2004 |
| JP | 3620528 B2 | 11/2004 |

(Continued)

OTHER PUBLICATIONS

Foreign Office Action issued on Jan. 21, 2014 with partial English translation.

(Continued)

*Primary Examiner* — Bryan Junge
(74) *Attorney, Agent, or Firm* — Rabin & Berdo, P.C.

(57) ABSTRACT

A method of manufacturing a semiconductor device that sufficiently activates a deep ion injection layer and fully recovers lattice defects generated in the ion injection process. Laser light pulses are successively emitted to form substantially CW (continuous wave) laser light. This feature of the invention stably performs activation of a deep ion injection layer at about 2 μs with few defects.

7 Claims, 20 Drawing Sheets

(56) References Cited

FOREIGN PATENT DOCUMENTS

| | | |
|---|---|---|
| JP | 2005-223301 A | 8/2005 |
| JP | 2006-351659 A | 12/2006 |
| JP | 2007-059431 A | 3/2007 |
| JP | 4043865 B2 | 11/2007 |
| JP | 4088011 B2 | 2/2008 |
| JP | 2008-244446 A | 10/2008 |
| JP | 2008-270243 A | 11/2008 |
| JP | 2008-277599 A | 11/2008 |
| JP | 2009-032858 A | 2/2009 |
| JP | 2009-267095 A | 11/2009 |
| JP | 2009-283636 A | 12/2009 |

OTHER PUBLICATIONS

Chinese Office Action dated Dec. 9, 2014, Partial English translation.

* cited by examiner

PRIOR ART

PRIOR ART

PRIOR ART

PRIOR ART

PRIOR ART

PRIOR ART

US 9,418,852 B2

METHOD OF MANUFACTURING A SEMICONDUCTOR DEVICE

CROSS-REFERENCE TO RELATED APPLICATION

This application is based on, and claims priority from, Japanese Patent Application No. 2010-143825, filed on Jun. 24, 2010, the contents of which are incorporated herein by reference.

BACKGROUND OF THE INVENTION

1. Field of the Invention

The present invention relates to a method of manufacturing semiconductor devices such as ICs (integrated circuits), MOSFETs (MOS field effect transistors), and IGBTs (insulated gate bipolar transistors).

2. Description of the Related Art

In recent years, computers and communication equipment have frequently used, in their essential parts, integrated circuits (ICs) in which a plurality of transistors, resistors and the like are combined to construct an electronic circuit and integrated on one chip. An IC containing a power semiconductor element is called a power IC.

An IGBT is a power element composed in one chip exhibiting the high speed switching and voltage driving characteristics of a MOSFET and the low ON voltage characteristic of a bipolar transistor. Applications of IGBTs are expanding to industry fields including general purpose invertors, AC servo devices, uninterrupted power supplies (UPSs), switching power supplies and the like, as well as household appliances including microwave ovens, rice cookers, strobes and the like.

Development efforts are advancing towards next generation devices using new chip structures and exhibiting a low ON voltage to achieve low power consumption and high efficiency in apparatuses that employ them.

Structures of IGBTs include a punch-through (PT) type, a non-punch through (NPT) type, and a field stop (FS) type. Almost all the IGBTs that are presently mass-produced have an n-channel vertical double diffusion structure, except in some audio power amplifiers, which use a p-channel type element. The present specification also describes n-channel IGBTs.

The PT type comprises an $n^+$ layer (an n buffer layer) between a $p^+$ type epitaxial substrate and an $n^-$ layer (an n type active layer), and a depletion layer in the n type active layer reaches the n buffer layer. The PT type is a basic structure in the mainstream of IGBTs. In a system of breakdown voltage of 600 V, for example, though a thickness of 70 μm is sufficient for the active layer, a total thickness including the $p^+$ type substrate amounts to 200 μm to 300 μm. Accordingly, NPT type IGBTs employing a shallow $p^+$ collector layer with a low dose amount and the FS type IGBTs having a field stop layer are being developed using a FZ (floating zone) substrate without using an epitaxial substrate in order to obtain a low cost chip.

FIG. 13 is a sectional view of an NPT type IGBT. The NPT type, which does not use a $p^+$ substrate, has a substantially reduced total thickness of a substrate 51 as compared with the PT type, which uses an epitaxial substrate. This structure allows control of a hole injection rate, thereby achieving high speed switching without life time control, although ON voltage may be rather high depending on a thickness and resistivity of the n-type active layer 51a. Chip cost reduction is, however, possible owing to the use of an FZ substrate 51 without using a $p^+$ epitaxial substrate as described above. In FIG. 13, the reference numeral 52 represents a p type base layer; 53, an n-type emitter layer; 54, a gate oxide film; 55, a gate electrode; 56, an interlayer dielectric film; 57, a front surface electrode that is an emitter electrode; 62, a p type collector layer; and the reference numeral 63 represents a rear surface electrode that is a collector electrode.

FIG. 14 is a sectional view of an FS type IGBT. The FS type IGBT has basically the same structure as of the PT type IGBT. The FS type IGBT uses an FZ substrate 51 without using a $p^+$ epitaxial substrate and has a total thickness of the substrate 51 of 100 μm to 200 μm. The n-type active layer 51a has a thickness of about 70 μm corresponding to a breakdown voltage of 600 V as in the case of the PT type, and is depleted. Accordingly, an n type layer, being an n type field stop (FS) layer 61, is provided under the n-type active layer 51a. In the collector side, a shallow $p^+$ diffusion layer is used for a low injection dose collector that is a p-type collector layer 62. This structure does not need lifetime control as in the case of the NPT type. In addition, a structure combining this FS type IGBT with a trench IGBT structure (not shown in the figure) is known, and intended to provide further reduction of ON voltage, in which a narrow and deep groove is formed from the chip front surface and a MOSFET structure is formed on the side surface of the trench. Reduction of the total thickness is in progress recently by means of design optimization.

In recent years, matrix converters that directly perform AC to AC conversion without intermediate DC are drawing attention. The matrix converter does not need a capacitor, which is different from conventional inverters, and has an advantage of decreasing higher harmonics in a power supply. However, since the input is AC, a reverse withstand voltage capability is required for semiconductor switches in the matrix converter. If a conventional IGBT is used, a series-connected diode is required for blocking a reverse voltage. A reverse-blocking IGBT, as shown in FIG. 15, has reverse blocking ability following basic characteristics of a conventional IGBT. The basic structure is the same as that of the NPT type IGBT except that an isolation layer is formed in the reverse-blocking IGBT. A reverse-blocking IGBT, owing to elimination of a series-connected diode, reduces a conduction loss to about a half, contributing considerable enhancement of a conversion efficiency of a matrix converter. High performance reverse blocking IGBTs have been manufactured by combining the technologies of forming a deep junction (formation of a p type isolation layer) of about 100 μm or more and of manufacturing a very thin wafer of about 100 μm thick or less. In FIG. 15, the reference numeral 70 represents a passivation film.

For achieving a thin IGBT with a thickness of about 70 μm, there are many technological problems in the manufacturing process, including the occurrence of warping, which may arise due to rear surface back-grinding, ion injection from the rear surface, and rear surface heat treatment required in the manufacturing process. The manufacturing process will be described for an FS type IGBT as follows.

FIGS. 16 through 20, showing a method of manufacturing a conventional semiconductor device, are sectional views of essential parts of the semiconductor device illustrated in a sequence of the manufacturing process. The semiconductor device is an FS type IGBT in the following description.

(1) A gate oxide film 54 ($SiO_2$) and a gate electrode 55 of polycrystalline silicon (poly-Si) are deposited on an FZ-N substrate 51 and worked. On the surface of the gate electrode 55, an interlayer dielectric film 56 (BPSG in this example) is deposited and worked to produce an insulated gate structure.

(2) A p base layer 52 (p$^+$) is formed in the surface region of the FZ-N substrate 51 and then, an n-type emitter layer 53 is formed in the p base layer 52.

(3) A front surface electrode 57 that is an emitter electrode composed of aluminum-silicon film in contact with the n-type emitter layer 53. The aluminum-silicon film is then heat treated at a relatively low temperature of 400° C. to 500° C. in order to achieve a stable joint performance and low resistance wiring. Though not depicted, an insulating protection film of a polyimide film is formed covering the front surface.

A process in the front surface side has been completed up to this step as shown in FIG. 16.

(4) The FZ-N substrate 51 is made thin by means of back grinding, etching or other technique from the rear surface 58 down to a desired thickness as shown in FIG. 17.

(5) Then, as shown in FIG. 18, ion injection is conducted from the rear surface 58 to form ion injection layers 59 and 60 for forming an n type layer that is a field stop (FS) layer 61 and a high concentration p type collector layer 62 (p$^+$ layer), respectively (these two layers are indicated in FIG. 19). In some cases, a p layer of $BF_2$ is injected as a contact layer onto the rear surfaced 58 to obtain a high concentration layer after boron ion injection in order to establish ohmic contact with a rear surface electrode 63 that is a collector electrode.

(6) Heat treatment for annealing is conducted using an electric furnace (not illustrated in the figures). The heat treatment temperature is a relatively low temperature in the range of 350° C. to 500° C. In this step, a field stop layer (an FS layer) 61 (an n layer) and a p type collector layer 62 (a p$^+$ layer) are formed as shown in FIG. 19.

(7) After that, a rear surface electrode 63 is formed in combination of metal films selected from an aluminum layer, a titanium layer, a nickel layer, a gold layer and the like on the high concentration p type collector layer 62 (a p$^+$ layer) as shown in FIG. 20.

(8) Though not illustrated, after dicing into chips, aluminum wires are fixed onto the surface of the front surface electrode 57 using an ultrasonic wire bonding apparatus. The rear surface electrode 63 is joined onto a base through a solder layer. Thus, an FS type IGBT is completed.

There are several methods in the annealing step (6) that use laser annealing that allows heating solely in the surface region for activating the ion injected layer.

Japanese Unexamined Patent Application Publication No. 2003-059856 discloses use of YAG 3ω and YAG 2ω laser for activating the n layer.

Japanese Patent No. 4043865 discloses use of two laser apparatus for activating an ion injected layer.

Japanese Unexamined Patent Application Publication No. 2005-223301 discloses a method to activate an impurity layer using two laser irradiation apparatus that irradiate with pulse laser and form wide pulses.

Japanese Patent No. 4088011 discloses an activation rate of impurities in a rear surface region of an FS IGBT.

Japanese Unexamined Patent Application Publication No. 2009-032858 discloses a laser irradiation apparatus comprising a first light source and a second light source that emit laser pulses with different wavelengths, and an optical system that irradiates an work piece with an overlap between irradiated areas.

Japanese Unexamined Patent Application Publication No. 2008-270243 discloses use of two laser oscillators (laser light emission devices), and irradiation by a wide pulse laser formed from a former pulse and a latter pulse that is emitted after an inserted delayed time.

Some problems in the above-described conventional examples are described below.

1) Despite intending full activation down to the FS layer 61 (an n layer) of an FS type IGBT, it is impossible to accomplish satisfactory activation with the heat treatment at a relatively low temperature of 350° C. to 500° C. using an electric furnace.

2) Even if the pulse width is elongated or the repeating frequency is increased as described above, when an interruption exists in the laser light irradiation, the temperature in the heated place decreases during the interruption period. As a result, as shown in FIG. 21, heat is not conducted sufficiently to a deep FS layer 61 (an n layer) at about 2 μm from the surface, which causes an unstable concentration profile and insufficient recovery of defects in the FS layer. Therefore, satisfactory activation cannot be achieved.

(3) Laser irradiation undesirably affects the front surface side when conducted only from the rear surface 58 side by conventional methods. For example, the laser irradiation process may raise the temperature of the functional structure on the front surface side and fuse the front surface electrode 57.

(4) The output power of an ordinary continuous wave (CW) laser is very much lower than that of a normal pulse laser. Consequently, sufficient activation is impossible. A short pulse laser, on the other hand, though it delivers output power with a high energy density, cannot activate an ion injection layer 59 (to become an FS layer) at a deep position from the rear surface 58 as shown in FIG. 21, and further, cannot fully recover the lattice defects.

(5) Irradiation of a high energy density laser causes a surface profile to be a box profile, resulting in variation of depth of diffusion layers, which are a p type collector layer 62 and an FS layer 61.

(6) Japanese Patent No. 4043865, Japanese Unexamined Patent Application Publication No. 2009-032858, and Japanese Unexamined Patent Application Publication No. 2008-270243, as referred to above, disclose that two laser light pulses are used to obtain a wide pulse that is emitted for annealing. However, these documents do not disclose such a method of manufacturing a semiconductor device using a plurality of laser light pulses to form laser light with a substantially CW waveform, and performing annealing of the ion injection layer by irradiation of the substantially CW laser light.

SUMMARY OF THE INVENTION

In view of the above-described problems, it is an object of the present invention to solve the above-problems and provide a method of manufacturing a semiconductor device that sufficiently activates a deep ion injection layer (an FS layer) and fully recovers lattice defects generated in the ion injection process.

In order to accomplish the above object, a method of manufacturing a semiconductor device according to the invention comprises steps of: forming a front surface structure of a semiconductor element on a first principal surface of a semiconductor substrate; grinding a second principal surface in the rear surface side of the semiconductor substrate down to a predetermined thickness; forming an ion injection layer in the second principal surface side of the semiconductor substrate that has the predetermined thickness; and activating the ion injection layer by means of a laser annealing process; wherein the step of activating the ion injection layer is conducted by using a plurality of laser emission devices, each of the laser emission devices emitting laser light with a predetermined repeating frequency and a predetermined pulse width, and repeating a laser light emission procedure in a first period of time determined from the predetermined repeating frequency, the procedure including: emission of a first laser light pulse from a first laser emission device of the plurality of laser emission devices, emission of a second light pulse from a second laser emission device at an end of the first laser light pulse, emission of a third light pulse from a third laser emission device at an end of the second laser light pulse, and successive emission of n-th laser light pulse from an n-th laser emission device at an end of the (n−1)-th laser light pulse, followed by emission of the first laser light pulse from the first laser emission device at an end of the n-th light pulse, wherein n is a positive integer; the repeat of the laser light emission procedure forming laser light with a waveform of substantially CW laser light, which irradiates the ion injection layer to activate the ion injection layer.

A method of manufacturing a semiconductor device according to the invention as stated above wherein preferably a delay time is inserted between the end of one of the laser light pulses and start of the next laser light pulse.

A method of manufacturing a semiconductor device according to the invention as stated above, wherein preferably the predetermined repeating frequency is in a range of 2 kHz to 500 kHz, and the predetermined pulse width is in a range of 1 μs to 50 μs.

A method of manufacturing a semiconductor device according to the invention as stated above, wherein preferably an energy density per one pulse of the laser light pulses is in a range of 0.1 J/cm$^2$ to 5 J/cm$^2$.

A method of manufacturing a semiconductor device according to the invention as stated above, wherein preferably the semiconductor substrate is cooled in the process of laser light irradiation.

A method of manufacturing a semiconductor device according to the invention as stated above, wherein preferably the first principal surface is held by an electrostatic chuck or cooled, in the process of laser irradiation.

A method of manufacturing a semiconductor device according to the invention as stated above, wherein preferably the ion injection layer is a pn continued layer including a p type impurity layer containing injected p type impurities and a successively formed n type impurity layer containing injected n type impurities.

A method of manufacturing a semiconductor device according to the invention as stated above, wherein preferably the laser light pulses irradiate the ion injection layer in a period of time of m-times a first period of time determined from the predetermined frequency in which the laser light emission procedure is conducted, m being a positive integer; subsequently, the irradiation of laser light pulses is stopped during a second period of time; and the irradiation of laser light pulses is conducted again during the period of m-times the first period of time; the procedure consisting of the irradiation during the period of m-times the first period of time and the stop during the second period of time being repeated.

According to the present invention, laser light pulses are successively emitted to form substantially CW (continuous wave) laser light. This feature of the invention stably performs activation of a deep ion injection layer at about 2 μs with few defects, and is particularly advantageous for forming an FS layer.

Therefore, such a semiconductor device is obtained that exhibits a high activation rate and good characteristics.

In addition, the laser annealing method of the invention prevents a wafer from cracking therein, providing a method of manufacturing a semiconductor device that exhibits good electrical characteristics.

If the energy density of the substantially CW laser light is excessively high, a pause can be provided between periods of time of the laser light irradiation.

DETAILED DESCRIPTION OF THE INVENTION

Figure 1:
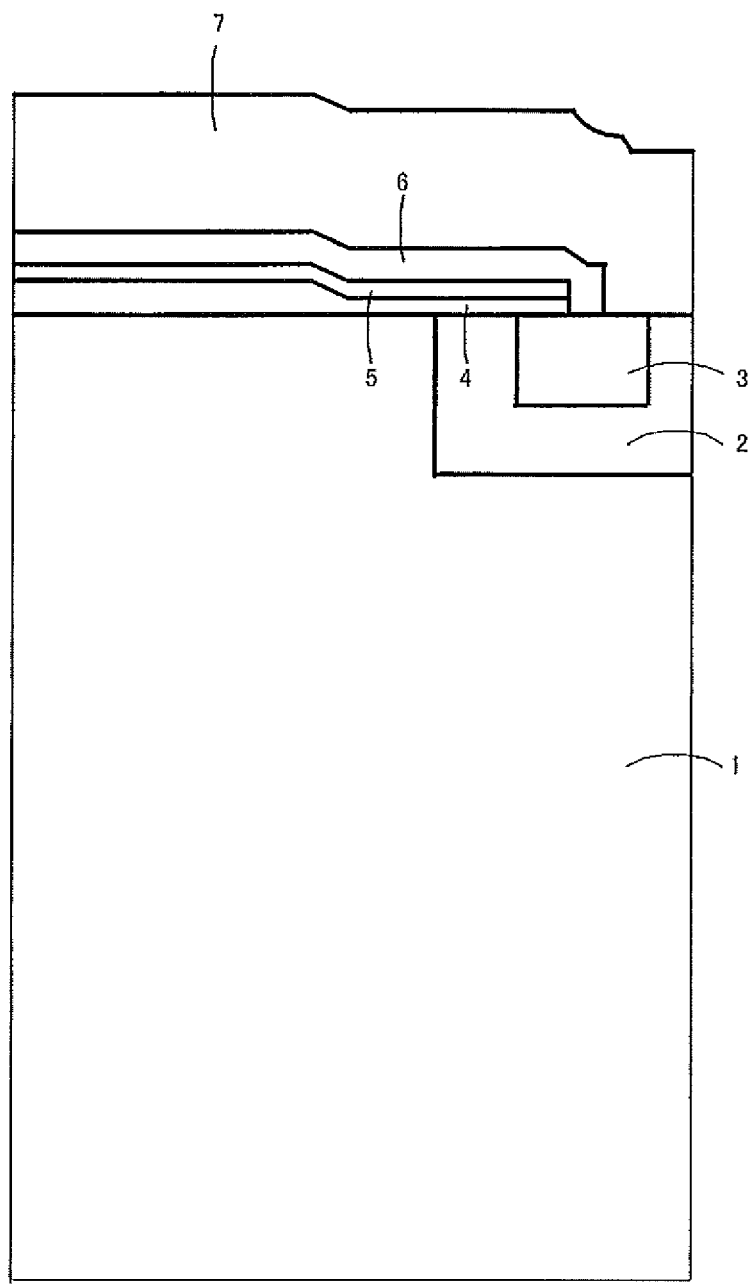
FIG. 1 is a sectional view of an essential part of a semiconductor device in a process of a method of manufacturing a semiconductor device of the first embodiment according to the present invention.

Some non-limiting preferred embodiments are described below with reference to the accompanying drawings.

Example 1

FIGS. 1 through 5 are sectional views of an essential part of a semiconductor device in a process of a method of manufacturing a semiconductor device of the first embodiment according to the present invention. The FIGS. 1 through 5 are shown in the order of manufacturing sequence. This embodiment is described on an example of an FS type IGBT.

(1) A gate oxide film 4 ($SiO_2$) and a gate electrode 5 of polycrystalline silicon (poly-Si) are deposited on a front surface side of an FZ-N substrate 1 and worked. On the surface of the gate electrode 5, an interlayer dielectric film 6 (BPSG in this example) is deposited and worked to produce an insulated gate structure.

(2) A p base layer 2 ($p^+$) is formed in the surface region of the FZ-N substrate 1 and then, an n type emitter layer 3 is formed in the p base layer 2.

(3) A surface electrode 7 that is an emitter electrode composed of aluminum-silicon film in contact with the n type emitter layer 3. The aluminum-silicon film is then heat treated at a relatively low temperature of 400° C. to 500° C. in order to achieve a stable joint performance and low resistance wiring. Though not depicted, an insulating protection film of a polyimide film is formed covering the front surface.

A step for forming a front surface structure of a semiconductor element in the front surface side has been completed up to this process, as shown in FIG. 1.

Figure 2:
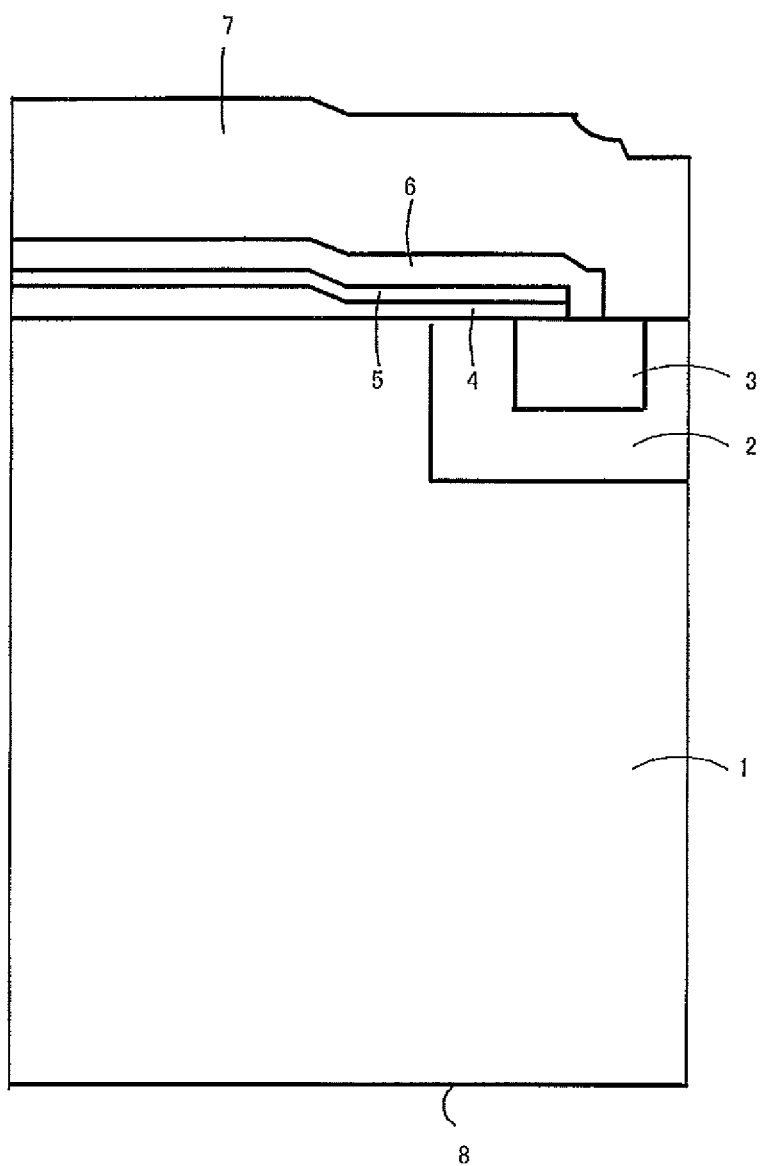
FIG. 2 is a sectional view of an essential part of a semiconductor device in a process following the process in FIG. 1 of a method of manufacturing a semiconductor device of the first embodiment according to the present invention.

(4) The FZ-N substrate 1 is made thin by means of back grinding, etching or other technique from the rear surface 8 down to a desired thickness as shown in FIG. 2.

Figure 3:
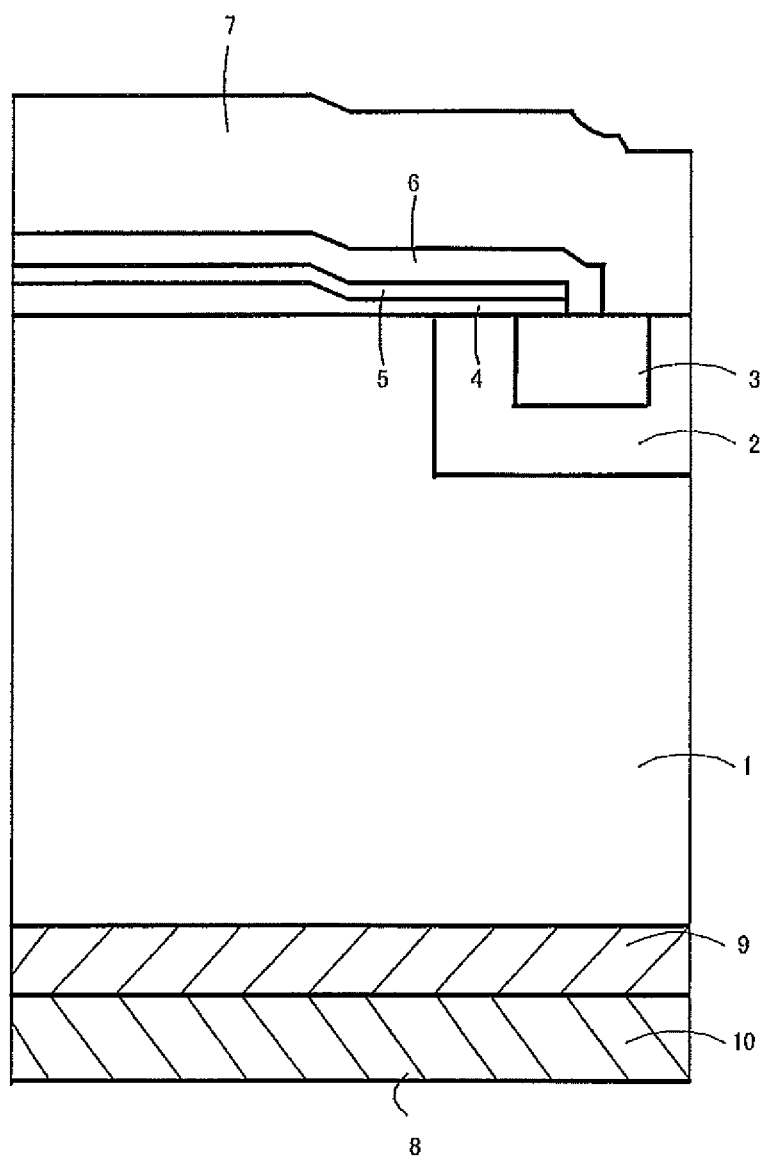
FIG. 3 is a sectional view of an essential part of a semiconductor device in a process following the process in FIG. 2 of a method of manufacturing a semiconductor device of the first embodiment according to the present invention.
Figure 4:
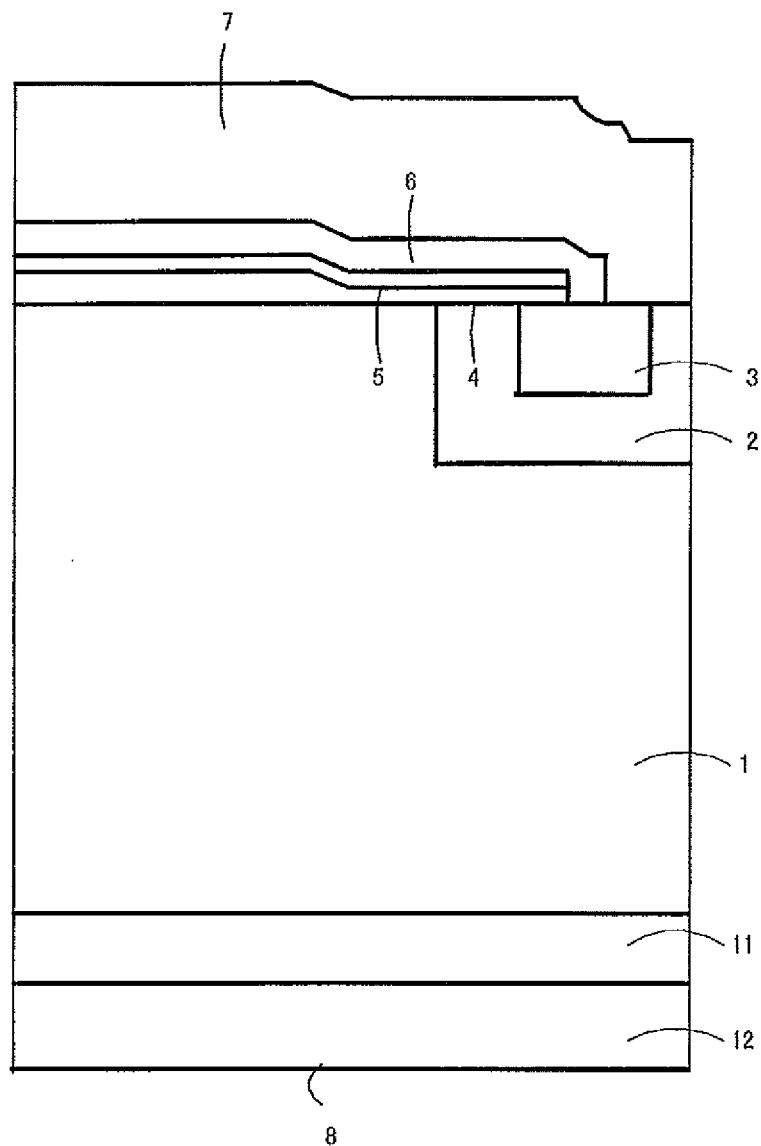
FIG. 4 is a sectional view of an essential part of a semiconductor device in a process following the process in FIG. 3 of a method of manufacturing a semiconductor device of the first embodiment according to the present invention.

(5) Then, as shown in FIG. 3, ion injection is conducted from the rear surface 8 to form ion injection layers 9 and 10 for forming an FS layer 11 (an n type layer) and a high concentration p type collector layer 12 ($p^+$ layer), respectively (these two layers are indicated in FIG. 4). In this embodiment example, phosphorus ions are injected for the n layer, and boron ions are injected for the p layer. In some cases, a p layer of $BF_2$ is injected as a surface contact layer onto the rear surface 8 to obtain a high concentration layer after boron ion injection in order to establish ohmic contact with a rear surface electrode 13.

Figure 6:
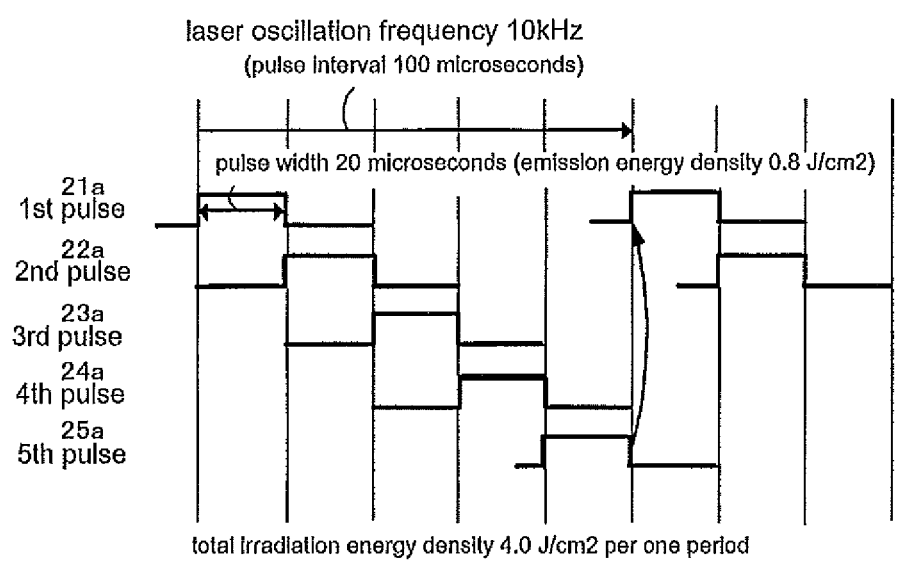
FIG. 6 is a timing chart of laser light pulses.
Figure 7:
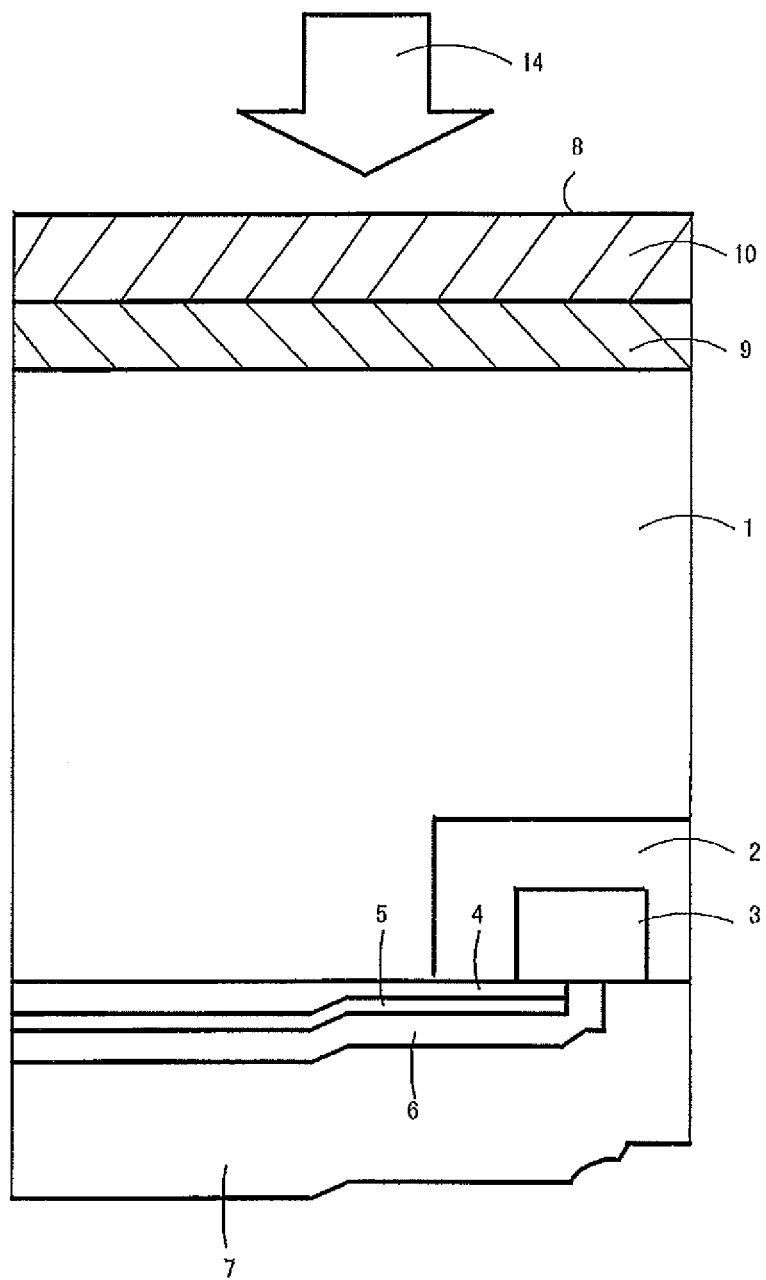
FIG. 7 illustrates a process of laser annealing.
Figure 8:
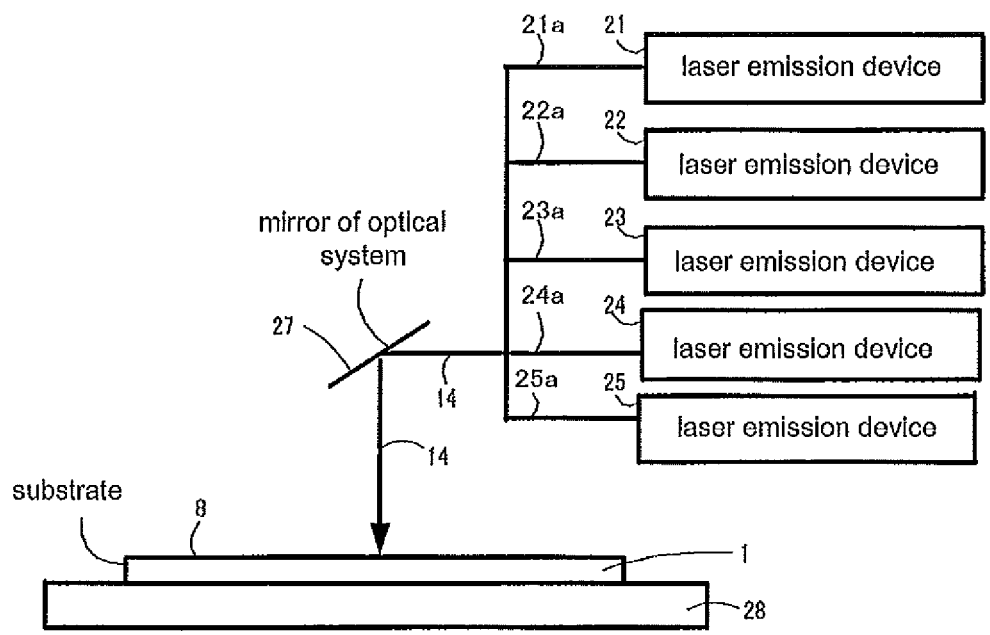
FIG. 8 illustrates a process of laser annealing having a substrate fixed by an electrostatic chuck.
Figure 9:
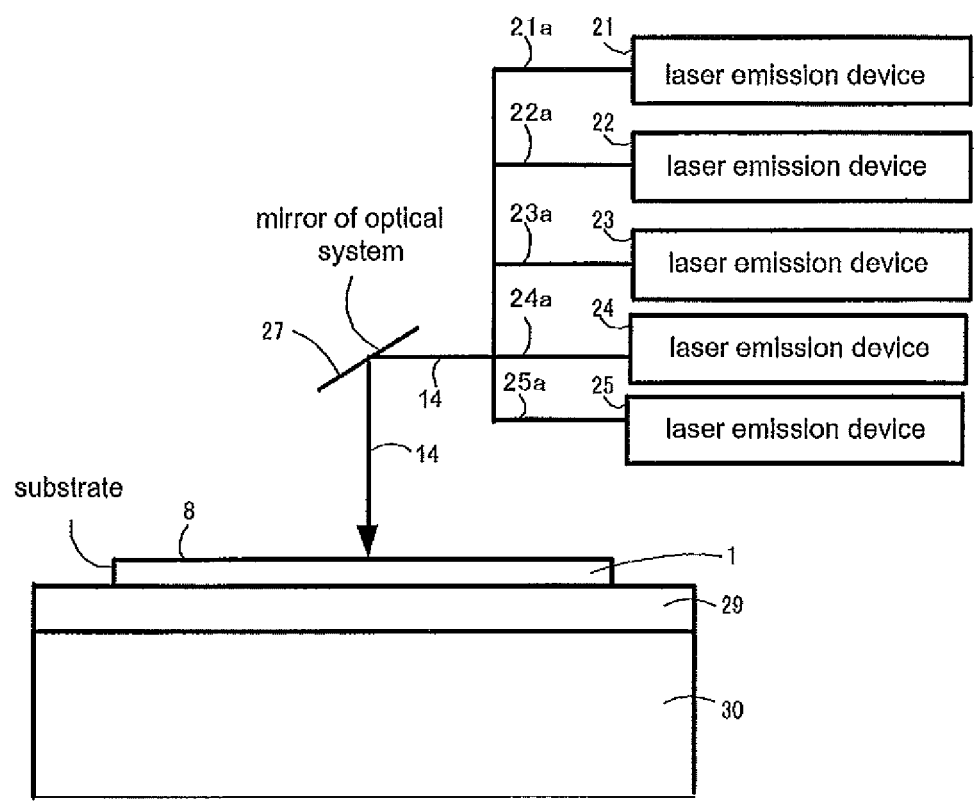
FIG. 9 illustrates a process of laser annealing having a substrate fixed to water cooled fins.

(6) Heat treatment is conducted by means of laser annealing irradiating the rear surface 8 with a laser light 14 having the substrate 1 stuck by an electrostatic chuck 28 as shown in FIG. 8, or having the substrate 1 cooled by a water cooled fins 30 interposing a backing plate 29 as shown in FIG. 9. The water cooling can be replaced by helium gas cooling. In this laser annealing step, the rear surface side directs upward as shown in FIG. 7. This laser annealing step forms an FS layer 11 (an n type layer) and a high concentration p type collector layer 12 ($p^+$ layer) as shown in FIG. 4. A method of the laser annealing is described more in detail afterwards referring to FIG. 6.

Figure 5:
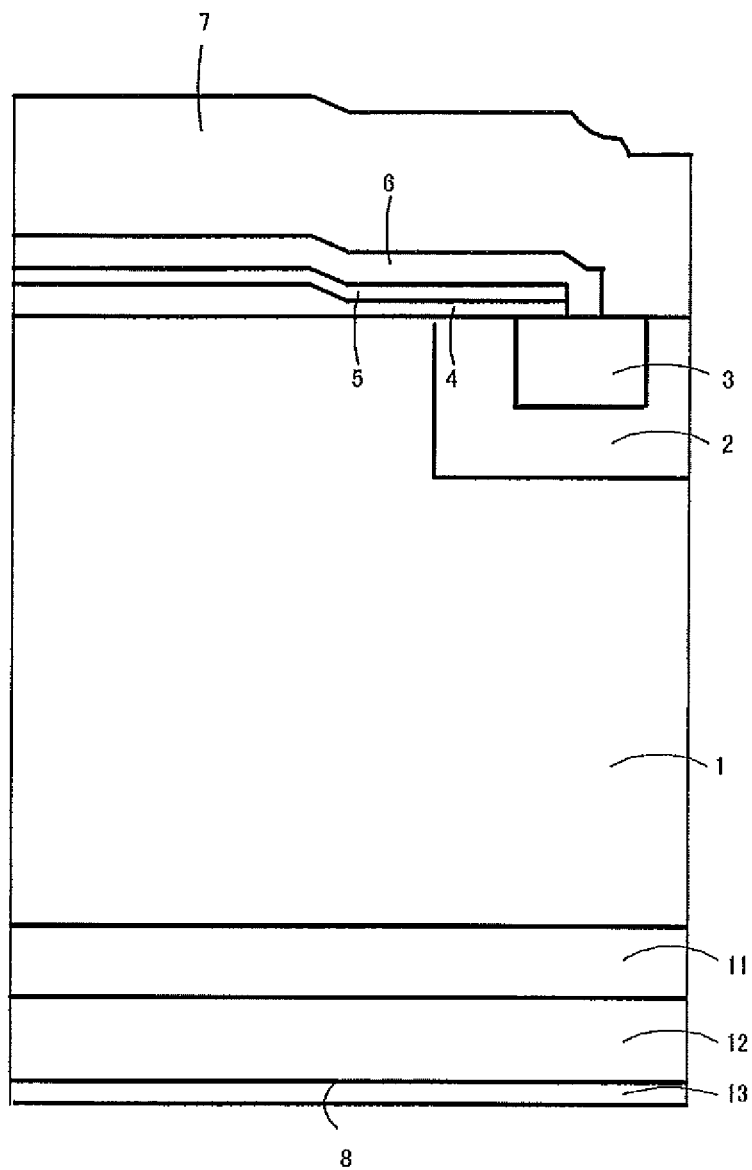
FIG. 5 is a sectional view of an essential part of a semiconductor device in a process following the process in FIG. 4 of a method of manufacturing a semiconductor device of the first embodiment according to the present invention.

(7) After that, a rear surface electrode 13 is formed in combination of metal films selected from an aluminum layer, a titanium layer, a nickel layer, a gold layer and the like on the high concentration p type collector layer 12 (a $p^+$ layer) as shown in FIG. 5.

(8) Though not illustrated, after dicing into chips, aluminum wires are fixed onto the surface of the front surface electrode 7 using an ultrasonic wire bonding apparatus. The rear surface electrode 13 is joined onto a base through a solder layer. Thus, an FS type IGBT is completed.

A method of laser annealing of the step (6) is described in the following. FIG. 6 is a timing chart of laser pulses. The laser annealing is carried out using five laser emission devices 21 through 25 that emit first laser light pulse 21a through fifth laser light pulse 25a, respectively, shown in FIG. 6. Each of the laser emission devices 21 through 25 emits laser light pulse 21a through 25a at a frequency of 10 kHz, which is equivalent to a period of 100 μs, with a pulse width of 20 μs. At the end of the first laser light pulse 21a emitted by the first laser emission device 21, the second laser light pulse 22a is emitted by the second laser emission device 22; at the end of the second laser light pulse 22a emitted by the second laser emission device 22, the third laser light pulse 23a is emitted by the third laser emission device 23. The processes like this are repeated until the fifth laser light pulse 25a is emitted by the fifth laser emission device 25. At the end of the fifth laser light pulse 25a emitted by the fifth laser emission device 25, the first laser light pulse 21a is again emitted by the first laser emission device 21. Repeating these processes, substantially continuous (or CW) laser light 14 (indicated in FIG. 8) is obtained. Succession of five laser light pulses 21a through 25a, each having a period of 20 μs, makes substantially CW laser light 14 with a period of 100 μs. Each of the laser light pulses 21a through 25a gives an energy density of 0.8 J/cm². A control device (not shown in the figures) controls emission timing of the five laser emission devices 21 through 25.

When the laser light irradiates one chip during a time period of 100 μs, the one chip is irradiated with an energy density of 0.8 J/cm²×5 pulses=4.0 J/cm², which is a sufficient energy density for satisfactory activation.

In order to obtain substantially CW laser light 14, a laser light pulses 21a through 25a preferably has a frequency in the range of 2 kHz to 500 kHz, a pulse width in the range of 1 μs to 50 μs, and an energy density of on pulse in the range of 0.1 J/cm² to 5 J/cm². If the frequency is less than 2 kHz or the pulse width is less than 1 μs, the number of laser emission devices increases, raising the manufacturing cost. On the other hand, a frequency of 500 kHz and a pulse width of 50 μs are practically sufficient for satisfactory laser annealing. An energy density of one pulse less than 0.1 J/cm² is less than the activation energy of the ion injection layers 9 and 10 and thus, insufficient for activation of the layers. An energy density larger than 5 J/cm² results in a box profile of a diffusion profile at the surface region, which causes variation in diffusion depth. In addition, such a high energy density fuses the front surface electrode 7, an aluminum electrode, of the FS type IGBT.

Laser annealing process in the conditions described above continuously heats the substrate 1 and sufficiently activates a deep ion injection layer 9 at about 2 μm.

The laser irradiation is conducted having the front surface side of the wafer, the substrate 1, securely held by an electrostatic chuck 28 as shown in FIG. 8. Consequently, the front surface electrode 7 is not affected by the heat, avoiding melting of the front surface electrode 7, an aluminum electrode, on the front surface of the IGBT. The same effect is obtained by an irradiation system construction as shown in FIG. 9, in which the substrate 1 is securely adhered to a backing plate 29 with a guide and cooled by water-cooled fins 30.

FIG. 8 and FIG. 9 are schematic drawings of the laser irradiation system. The five laser emission devices 21 through 25 emit laser light into undepicted fibers, which are bundled together to form a thick fiber. Continuous laser light 14 is emitted from the tip of the thick fiber and irradiates the substrate after reflection by a mirror 27 of the optical system. An irradiation time and energy of the laser light 14 is set at values necessary for activating the ion injection layers 9 and 10.

Figure 10:
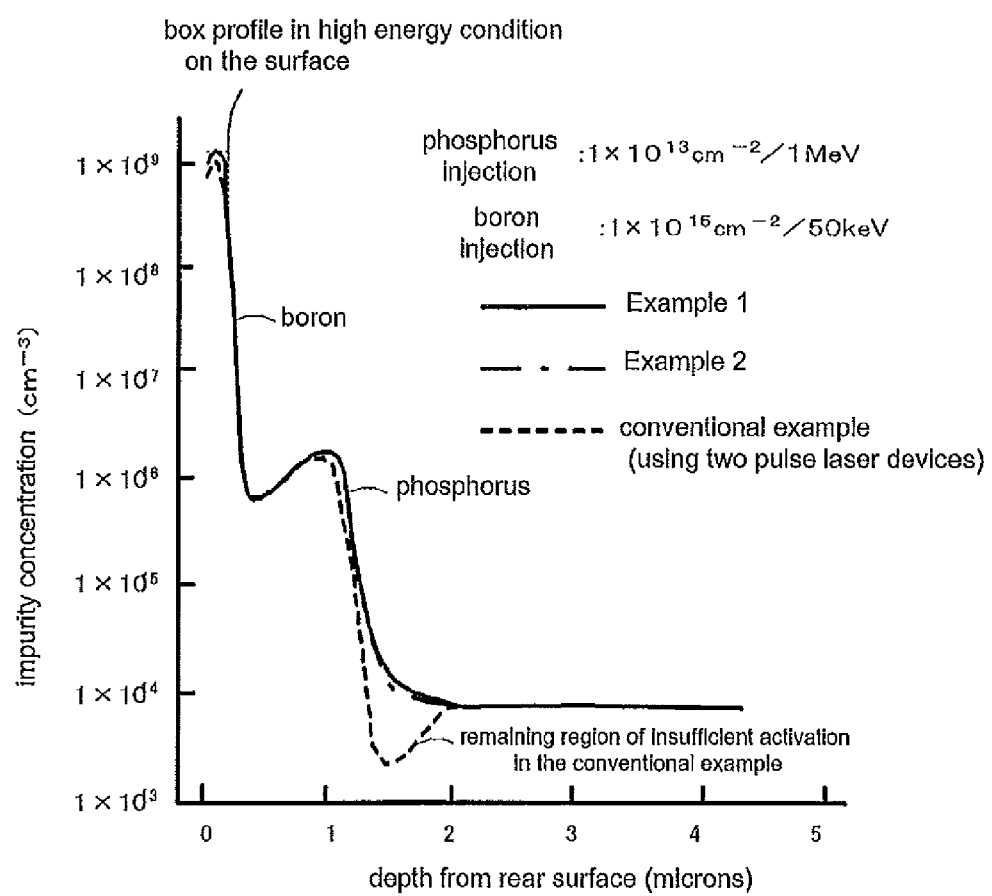
FIG. 10 shows a concentration profile obtained by a-spreading resistance probe method.

FIG. 10 shows concentration profiles obtained by the SR method. Profiles are shown for Example 1, Example 2, which is described later, and a conventional example. The method of the conventional example is the one disclosed in Japanese Unexamined Patent Application Publication No. 2005-223301, in which two laser devices emitting pulsed YAG 2ω laser with a pulse width of 100 ns is used to form a wide pulse of 200 ns that is emitted with an interval of 500 ns. Energy density is 2 J/cm² by one laser device and the total of 4 J/cm² (a constant value) by the two laser devices. An overlapping rate of irradiation is 90%. The amount of ion injection in the p layer, a boron injection layer, is $1 \times 10^{15}$ cm$^{-2}$ and an acceleration energy is 50 keV; and the amount of ion injection in the n layer, a phosphorus injection layer to become an FS layer, is $1 \times 10^{13}$ cm$^{-2}$ and an acceleration energy is 1.0 MeV. The incident angle in the ion injection is 7 degrees.

In the conventional example, the second laser emission device begins laser light emission at a time 500 ns after beginning of laser light emission by the first laser emission device. When the first laser emission device emits laser light during a time period of 200 ns, laser light emission is inactive or suspended in a time period of 300 ns. Because the temperature decreases during this inactive period of 300 ns, the activated depth is only up to about 1.3 µm. As can be seen in FIG. 10, activation is insufficient in the ion injection layer 9 at the depth of 2 µm. Lattice defects are not recovered, causing generation of leakage current.

In contrast, in Example 1 according to the present invention, successive pulses forming practically continuous laser light irradiate the substrate 1. Consequently, sufficient amount of heat reaches the deep ion injection layer 9 in FIG. 3 that becomes the FS layer 11 in FIG. 4, thereby activating the ion injection layer 9 at the depth of about 2 µm.

Thus, the method of Example 1 recovers the lattice defects generated in the deep ion injection layer 9 due to damages in the ion injection process. Since the energy density of the laser light 14 is relatively low, a box profile is not formed and a machining trace due to laser irradiation is not generated.

In the above-described embodiment example, a method of the invention is applied to activate the ion injection layers 9 and 10 that become pn continued layers of the FS layer 11 and the collector layer 12 in the rear surface 8 region of an FS type IGBT. A method of the invention can also be applied to activate a p layer of a collector layer on the rear surface side of an NPT type IGBT and an n layer of a drain layer on the rear surface side of a MOSFET.

If the energy density of the laser light 14 is excessively high, the energy density can be lowered. However, if the energy density is overly decreased, the substantially CW laser light is insufficient for satisfactory activation. This situation can be overcome by the following way.

Figure 11:
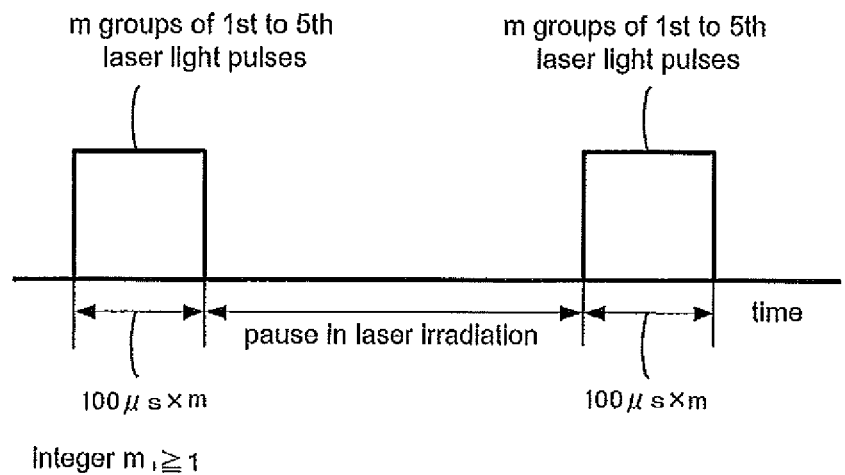
FIG. 11 shows a method for dealing with substantially CW laser light having an excessively large energy density.

FIG. 11 shows a method to cope with a case of overly high energy density of the substantially CW laser light.

Laser pulses are emitted in a period of m times the period determined by the frequency (a first period, which is 100 µs in the case of a frequency of 10 kHz). (m being a positive integer.) Then, a pause in the range of 0.1 to several seconds is taken to cease emission of the laser light pulses. After that, the laser light pulses are emitted again. These operations are repeated. If irradiation period of time of the laser light pulses is insufficient, the period determined by the frequency (the first period) is added. The pause is not necessarily the period determined by the frequency. The laser light irradiation time is a time period necessary for sufficiently activate the ion injection layer. The pause is determined in consideration of the time required by movement of the laser light spot to the next chip.

Example 2

Figure 12:
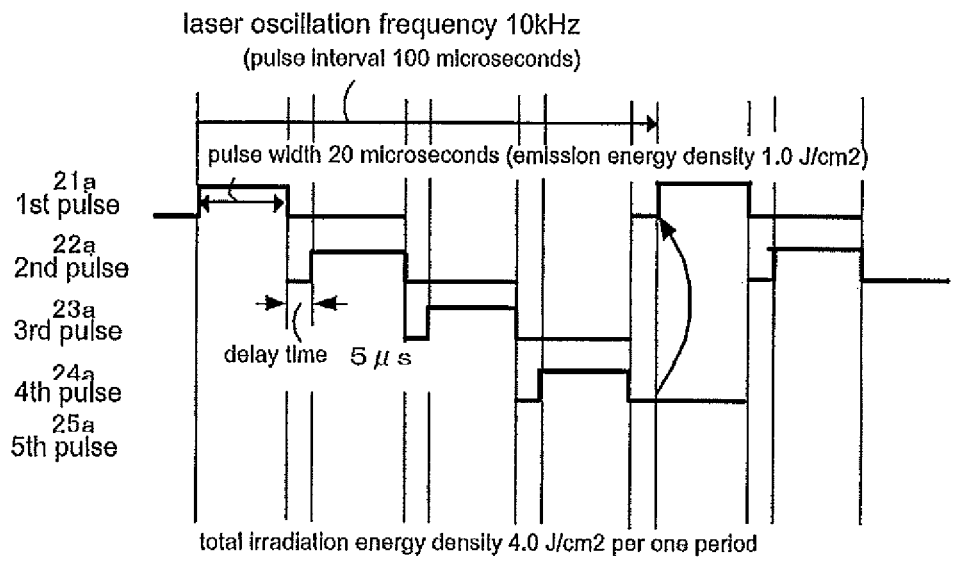
FIG. 12 illustrates the second embodiment of a method of manufacturing a semiconductor device according to the present invention.
Figure 13:
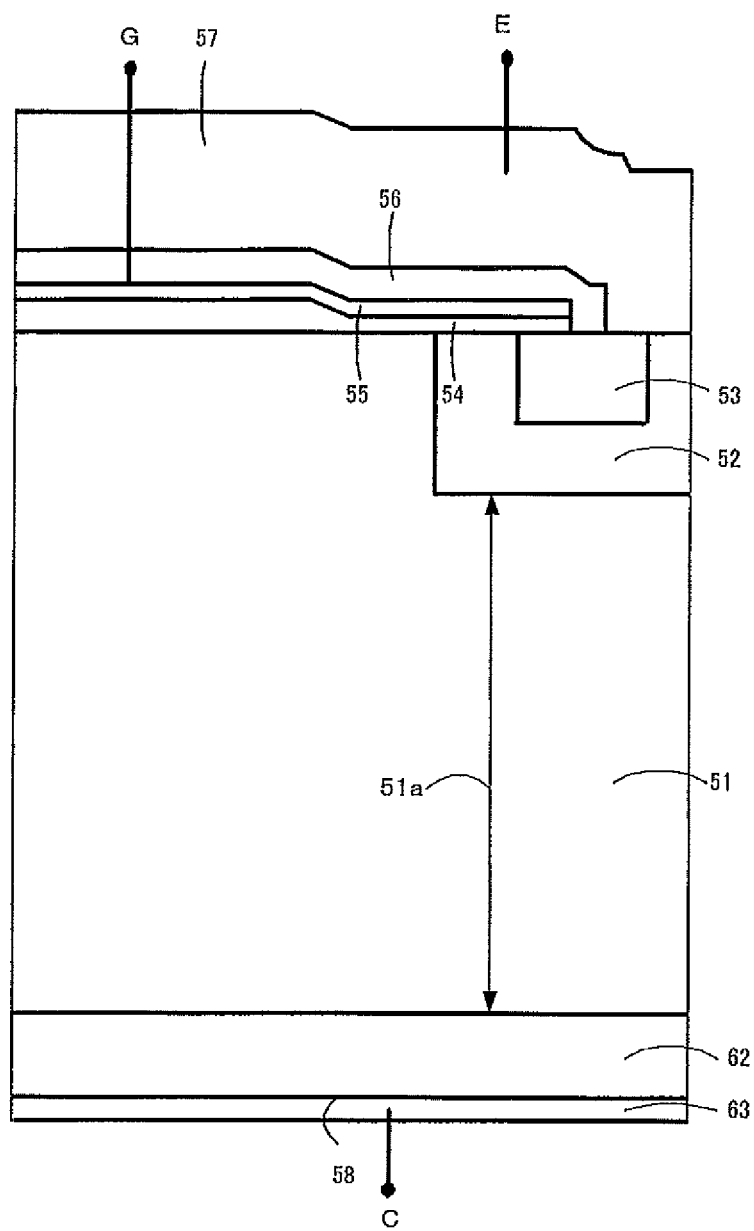
FIG. 13 is a sectional view of an NPT type IGBT.
Figure 14:
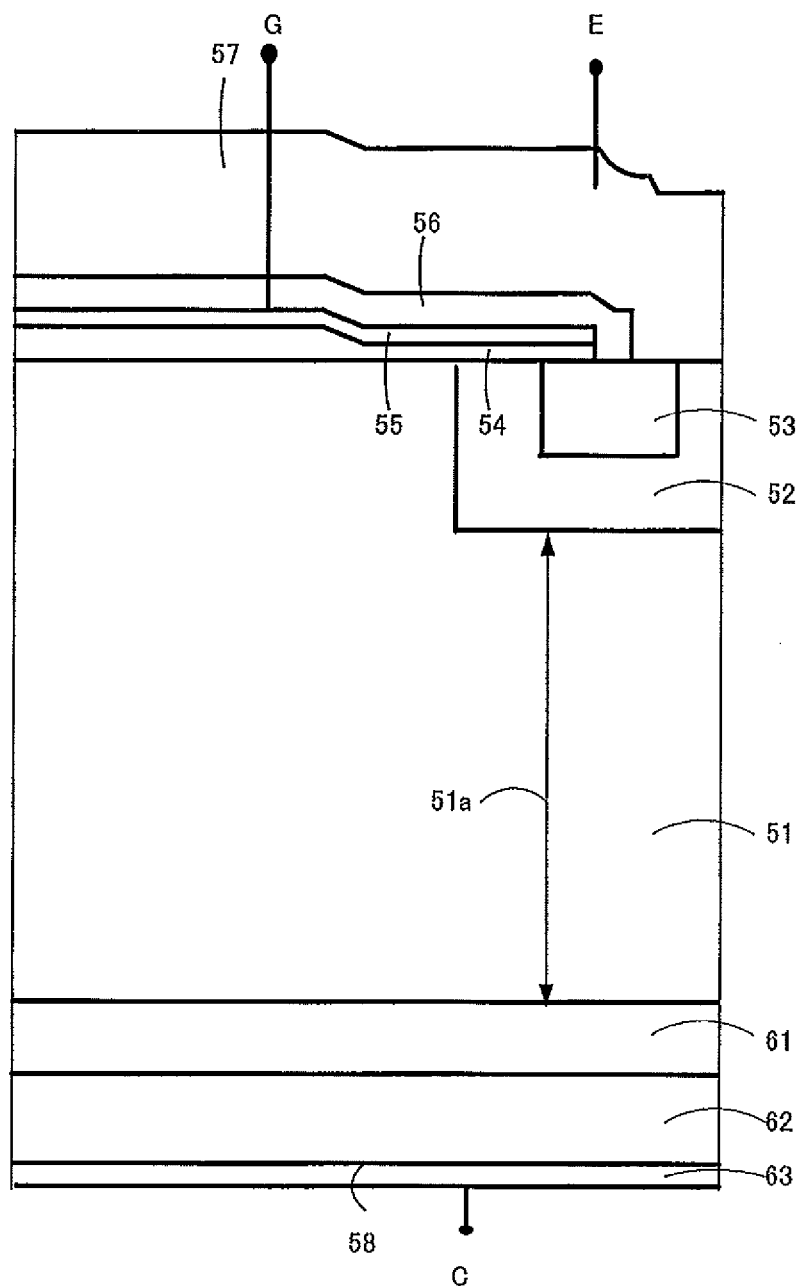
FIG. 14 is a sectional view of an FS type IGBT.
Figure 15:
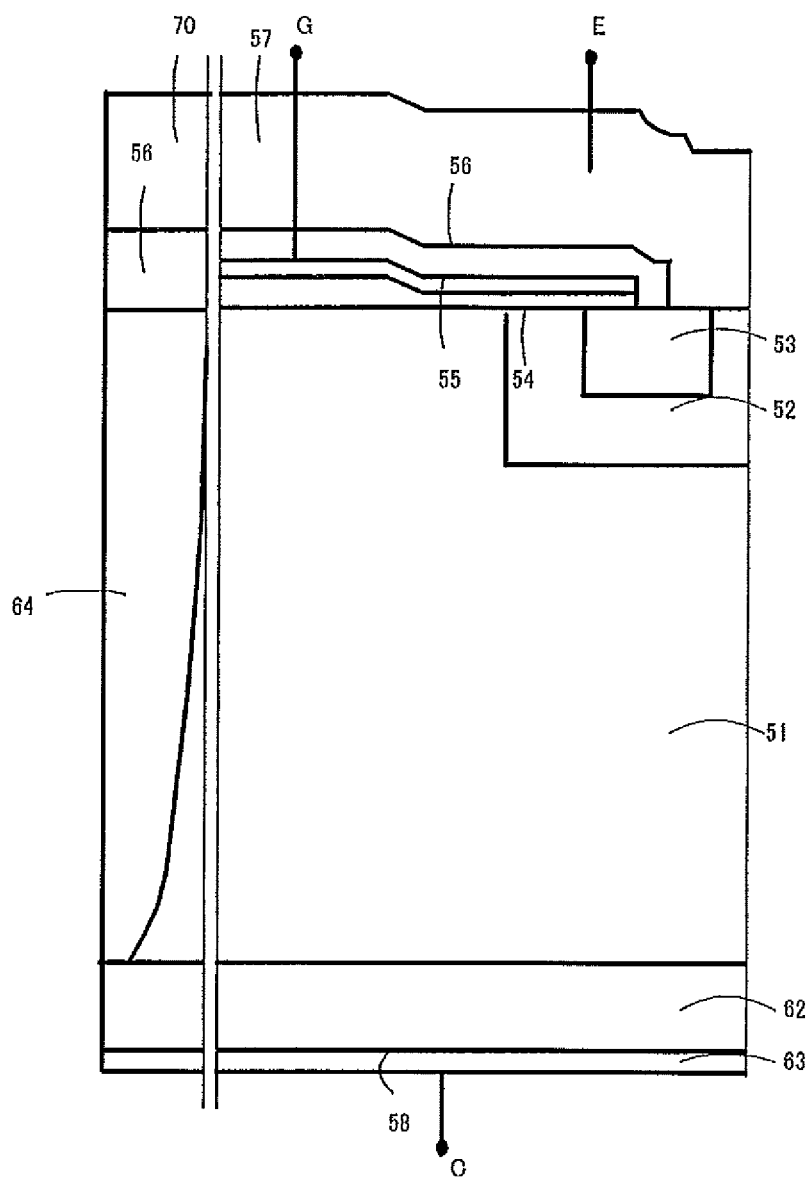
FIG. 15 is a sectional view of a reverse blocking IGBT.
Figure 16:
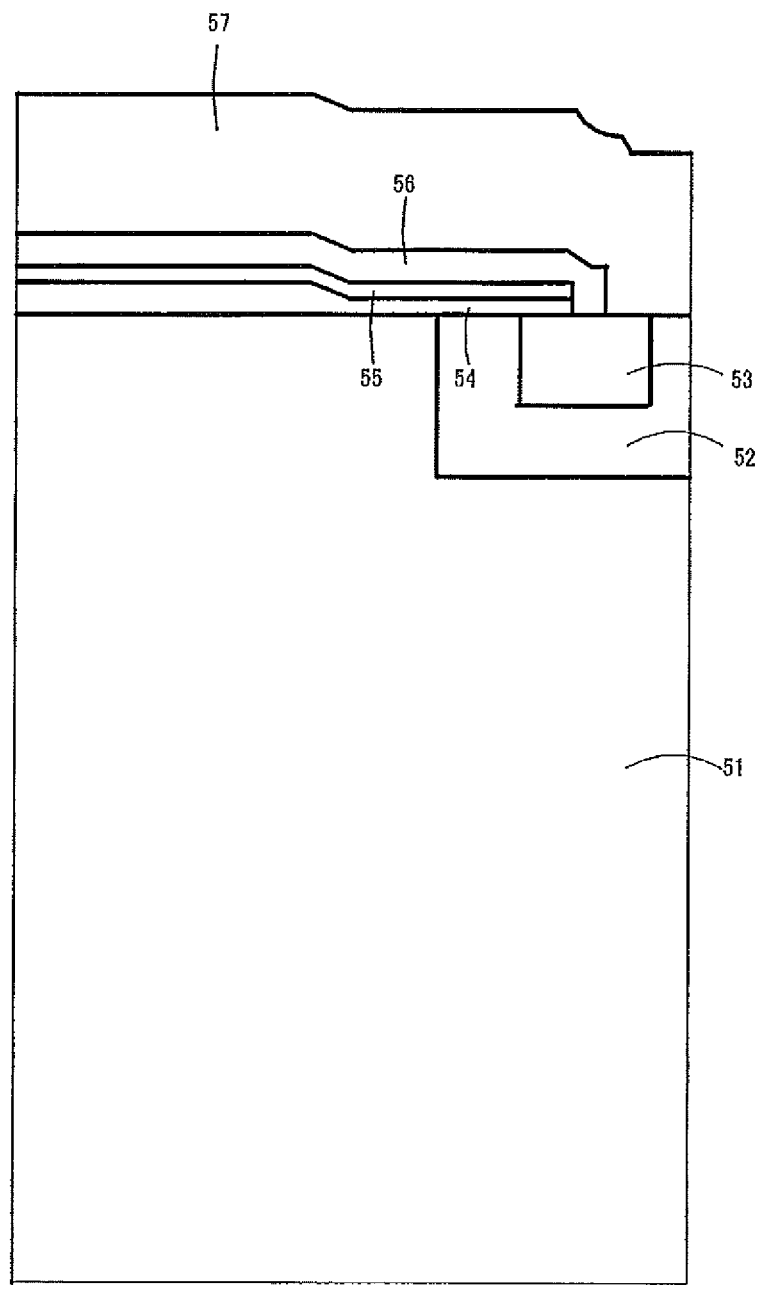
FIG. 16 is a sectional view of an essential part of a semiconductor device in a process of a conventional method of manufacturing a semiconductor device.
Figure 17:
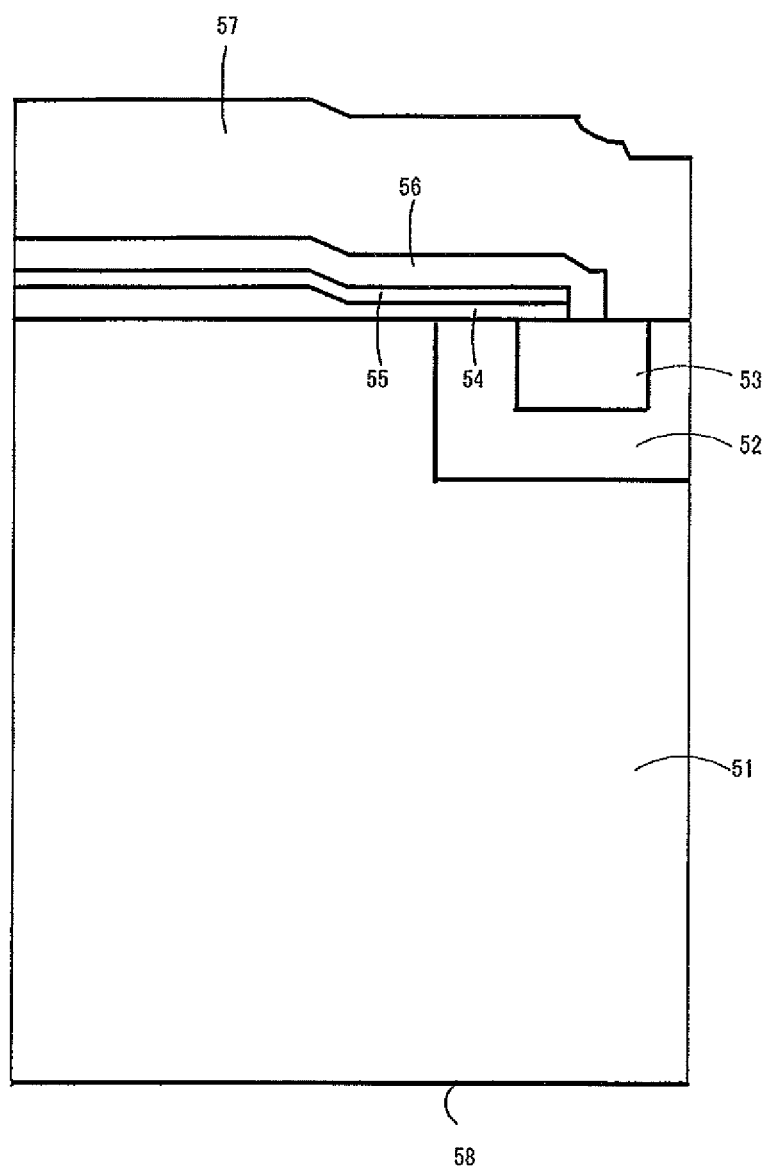
FIG. 17 is a sectional view of an essential part of a semiconductor device in a process following the process in FIG. 16 of a conventional method of manufacturing a semiconductor device.
Figure 18:
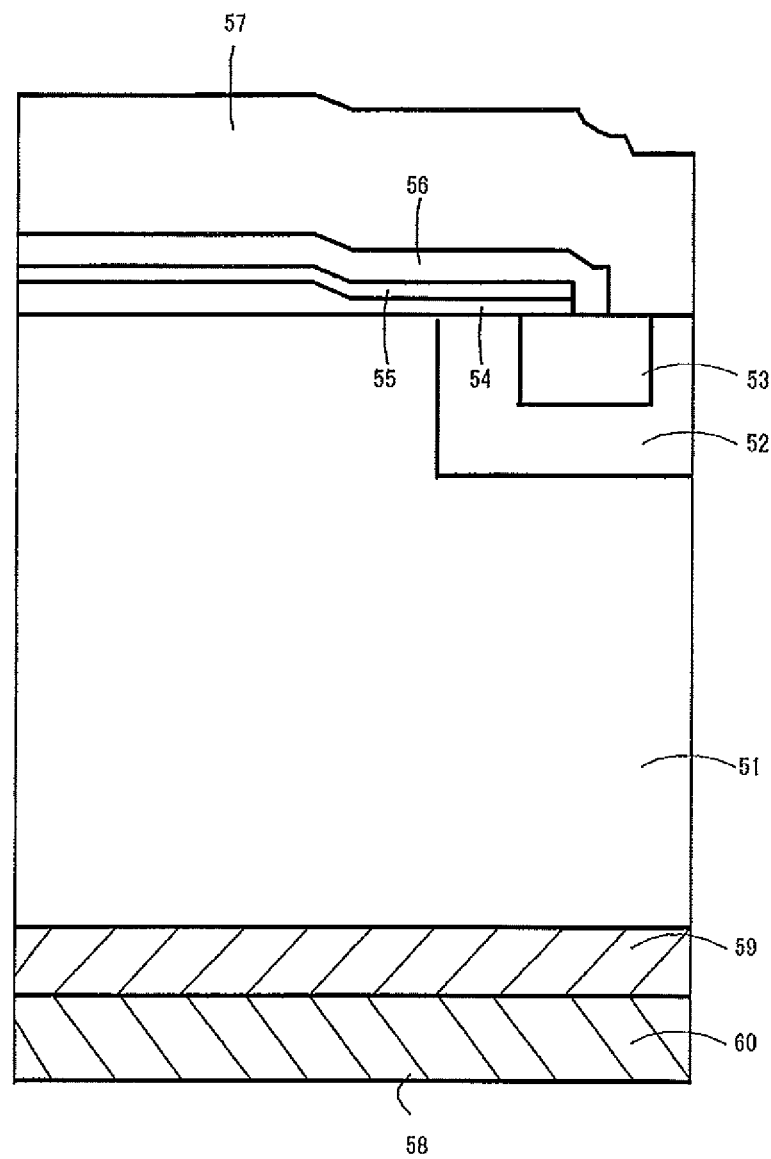
FIG. 18 is a sectional view of an essential part of a semiconductor device in a process following the process in FIG. 17 of a conventional method of manufacturing a semiconductor device.
Figure 19:
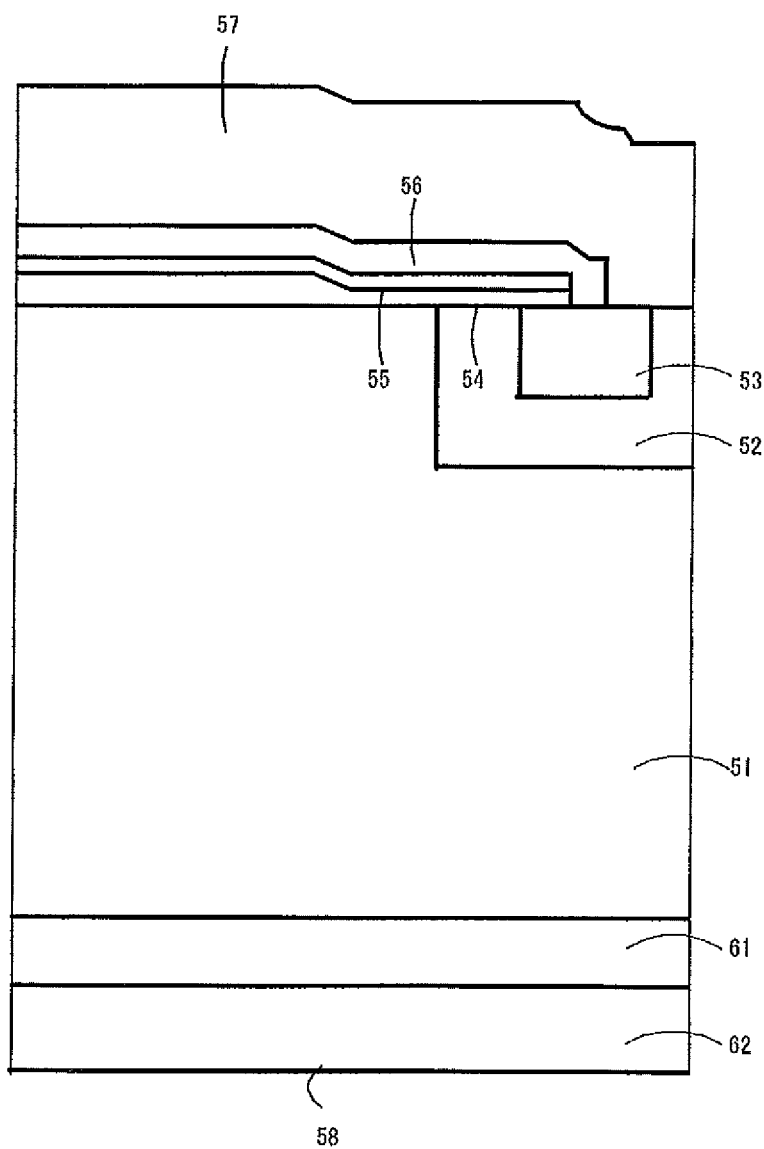
FIG. 19 is a sectional view of an essential part of a semiconductor device in a process following the process in FIG. 18 of a conventional method of manufacturing a semiconductor device.
Figure 20:
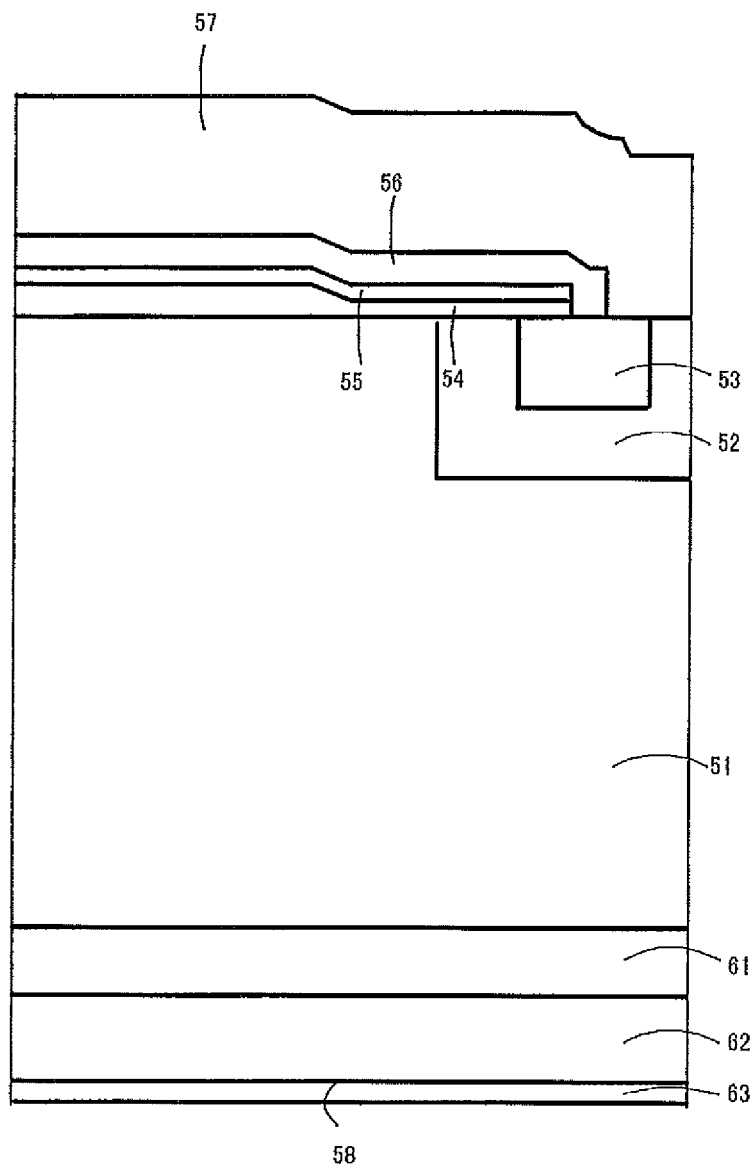
FIG. 20 is a sectional view of an essential part of a semiconductor device in a process following the process in FIG. 19 of a conventional method of manufacturing a semiconductor device.
Figure 21:
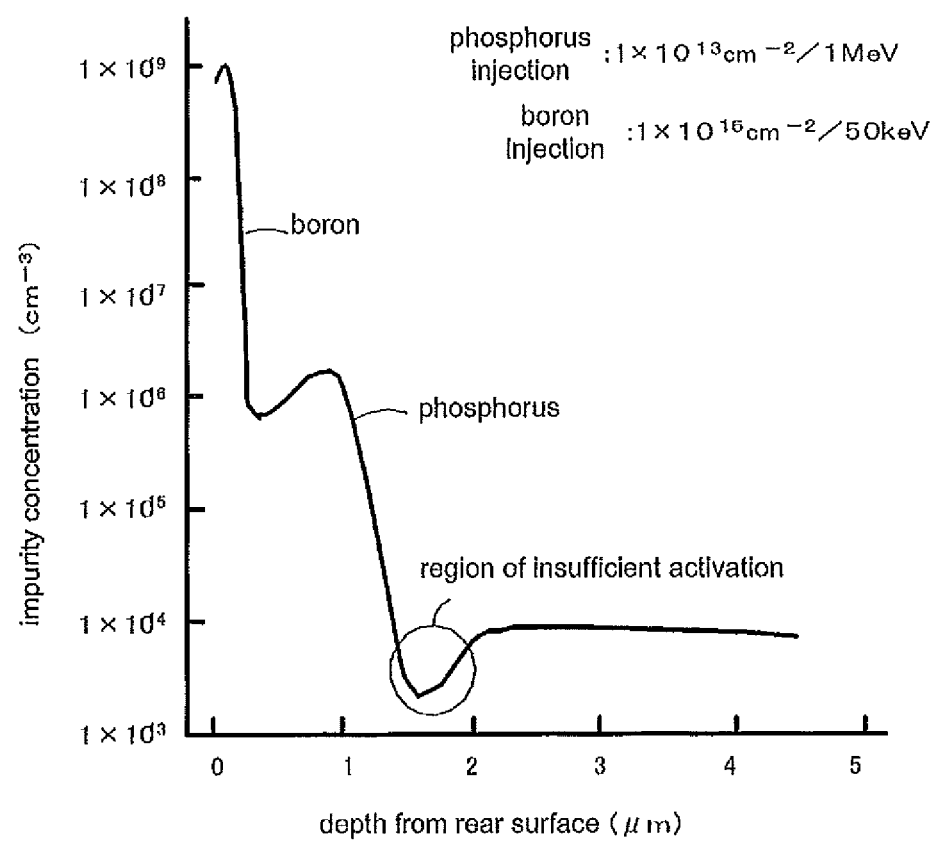
FIG. 21 shows a diffusion profile in the rear surface side of a conventional semiconductor device.

FIG. 12 shows a method of manufacturing a semiconductor device of the second embodiment example according to the present invention. The FIG. 12 is a timing chart of laser irradiation. The manufacturing steps are same as those in Example 1 except for the laser annealing process. Example 2 is also an example for an FS-IGBT.

The timing chart of FIG. 12 is different from the one in FIG. 6 in that an interval of 5 µs is taken between the laser light pulse 21a and the laser light pulse 22a, for example. The laser emission devices 21 through 25 are the same as those in FIG. 8 or FIG. 9, and an undepicted control device controls the starting time of emission of the laser light pulses 21a through 25a.

Each of the laser emission devices 21 through 25 emits a laser light pulse with a square waveform in a period of 20 µs and with emission energy density of 1 J/cm². After the end of irradiation in 20 µs by the first laser emission device 21, irradiation by the second laser emission device 22 is conducted interposing a delay time of 5 µs. Irradiation processes by the third and forth laser emission devices are conducted including the intermission of 5 µs. After irradiation by the fourth emission device and the intermission of 5 µs, irradiation by the first laser emission device 21 is conducted again. In order to avoid insufficient activation due to decrease in the temperature on the irradiated surface during the delay time, it is preferable to maintain the temperature of the irradiated surface at 500° C. or higher during the delay time.

The IGBT wafer is irradiated having the front surface side thereof held by an electrostatic chuck 28, as in Example 1, or securely adhered to a backing plate with a guide and cooled by water-cooled fins. Owing to these arrangements in the irradiation process, the surface electrode 7 of aluminum on the front surface of the IGBT does not melt and the front surface side is not affected by the heat.

As shown in FIG. 10, the inserted delay time slightly lowers the concentration of the boron injected layer and the concentration of the phosphorus injected layer, which is an FS layer, as compared with Example 1. However, device characteristics are not affected.

The laser annealing conditions as same as those in Example 1 can perform sufficient recovery of the lattice defects generated in the deep ion injection layer 9 due to damages in the ion injection process. Since the energy density of the irradiated laser light is low, a box profile is not formed even at the uppermost surface and a machining trace due to laser irradiation is not generated.

A fully solid state laser of YAG 2ω at a wavelength of 532 nm is used in Examples 1 and 2 described above. However, other types of laser can be used such as YLF 2ω, YVO4 (2ω), YAG 3ω, YLF 3ω, YVO4 (3ω), and the like. In place of a fully solid state laser, excimer laser can be used such as XeCl (308 nm), KrF, XeF, and the like.

The present invention is effective in the case of ion injection of dopants with a large diffusion coefficient such as sulfur, selenium, lithium, and hydrogen, as well as boron and phosphorus.

The type of the device in the above description is an FS type IGBT having an FS layer at a deep position from the rear surface. It has been confirmed that the invention can also be applied without a problem to a rear surface side n layer of the other types of devices including an NPT type IGBT, a reverse blocking IGBT, and a FWD (a free wheeling diode).

It will be appreciated by those skilled in the art that the examples described herein are non-limiting, and that the invention may be practiced other than as described herein without departing from the scope thereof.

What is claimed is:

1. A method of manufacturing a semiconductor device comprising steps of:
    forming a front surface structure of a semiconductor element on a first principal surface of a semiconductor substrate;
    grinding a second principal surface of the semiconductor substrate opposed to the first principal surface down to a predetermined thickness;
    forming an ion injection layer in the second principal surface side of the semiconductor substrate that has the predetermined thickness, wherein the ion injection layer is a pn continued layer including a p type impurity layer containing injected p type impurities and an n type impurity layer containing injected n type impurities, the n type impurity layer being formed after the p type impurity layer and deeper than the p type impurity layer as viewed from the second principal surface; and
    activating the ion injection layer by means of a laser annealing process;
    wherein the step of activating the ion injection layer is conducted by
    using a plurality of laser emission devices, each of the laser emission devices emitting laser light with a predetermined repeating frequency and a predetermined pulse width, and
    repeating a laser light emission procedure in a first period of time determined from the predetermined repeating frequency, the procedure including: emission of a first laser light pulse from a first laser emission device of the plurality of laser emission devices, emission of a second light pulse from a second laser emission device at an end of the first laser light pulse, emission of a third light pulse from a third laser emission device at an end of the second laser light pulse, and successive emission of n-th laser light pulse from an n-th laser emission device at an end of the (n−1)-th laser light pulse, followed by emission of the first laser light pulse from the first laser emission device at an end of the n-th laser light pulse, wherein n is a positive integer; the repeating of the laser light emission procedure forming laser light with a waveform of substantially continuous wave laser light, which irradiates the ion injection layer to activate the ion injection layer, wherein
    the predetermined pulse width is in a range of 1 μs to 50 μs,
    the laser light pulses irradiate the ion injection layer over a duration of a multiple of a first period of time corresponding to the predetermined repeating frequency;
    subsequently, the irradiation of laser light pulses is stopped during a second period of time; and the irradiation of laser light pulses is conducted again over the duration of the multiple of the first period of time;
    the procedure consisting of the irradiation over the duration of the multiple of the first period of time and the stop during the second period of time being repeated, and
    a duration of the second period of time is at least 100 ms.

2. The method of manufacturing a semiconductor device according to claim 1, wherein
    the predetermined repeating frequency is in a range of 2 kHz to 500 kHz.

3. The method of manufacturing a semiconductor device according to claim 1, wherein
    an energy density per one pulse of the laser light pulses is in a range of 0.1 J/cm$^2$ to 5 J/cm$^2$.

4. The method of manufacturing a semiconductor device according to claim 1, wherein the semiconductor substrate is cooled in the process of laser light irradiation.

5. The method of manufacturing a semiconductor device according to claim 1, wherein the first principal surface is held by an electrostatic chuck or cooled, in the process of laser irradiation.

6. The method of manufacturing a semiconductor device according to claim 1, wherein the temperature of the irradiated surface is maintained at 500° C. or higher during the second period of time.

7. A method of manufacturing a semiconductor device comprising steps of:
    forming a front surface structure of a semiconductor element on a first principal surface of a semiconductor substrate;
    grinding a second principal surface of the semiconductor substrate opposed to the first principal surface down to a predetermined thickness;
    forming an ion injection layer in the second principal surface side of the semiconductor substrate that has the predetermined thickness, wherein the ion injection layer is a pn continued layer including a p type impurity layer containing injected p type impurities and an n type impurity layer containing injected n type impurities; and
    activating the ion injection layer by means of a laser annealing process;
    wherein the step of activating the ion injection layer is conducted by
    using a plurality of laser emission devices, each of the laser emission devices emitting laser light with a predetermined repeating frequency and a predetermined pulse width,
    repeating a laser light emission procedure in a first period of time determined from the predetermined repeating frequency, the procedure including:
    emission of a first laser light pulse from a first laser emission device of the plurality of laser emission devices, emission of a second light pulse from a second laser emission device at an end of the first laser light pulse, emission of a third light pulse from a third laser emission device at an end of the second laser light pulse, and successive emission of n-th laser light pulse from an n-th laser emission device at an end of the (n−1)-th laser light pulse, followed by emission of the first laser light pulse from the first laser emission device at an end of the n-th laser light pulse, wherein n is a positive integer;
    the repeating of the laser light emission procedure forming laser light with a waveform of substantially continuous wave laser light, which irradiates the ion injection layer to activate the ion injection layer, wherein
    the predetermined pulse width is in a range of 1 μs to 50 μs,
    the laser light pulses irradiate the ion injection layer over a duration of a multiple of a first period of time corresponding to the predetermined repeating frequency,
    subsequently, the irradiation of laser light pulses is stopped during a second period of time,
    the temperature of the irradiated surface being maintained at 500° C. or higher during the second period of time,
    the irradiation of laser light pulses is conducted again over the duration of the multiple of the first period of time, the procedure consisting of the irradiation over the duration of the multiple of the first period of time and the stop during the second period of time is repeated, and a duration of the second period of time is at least 100 ms.

* * * * *